United States Patent
DiStefano et al.

(10) Patent No.: US 6,265,765 B1
(45) Date of Patent: Jul. 24, 2001

(54) FAN-OUT SEMICONDUCTOR CHIP ASSEMBLY

(75) Inventors: Thomas H. DiStefano, Monte Sereno; John W. Smith, Palo Alto, both of CA (US); Tony Faraci, Georgetown, TX (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 08/935,962

(22) Filed: Sep. 23, 1997

Related U.S. Application Data

(60) Division of application No. 08/653,016, filed on May 24, 1996, now Pat. No. 5,688,716, which is a continuation-in-part of application No. 08/440,665, filed on May 15, 1995, now Pat. No. 5,801,441, which is a division of application No. 08/271,768, filed on Jul. 7, 1994, now Pat. No. 5,518,964.

(51) Int. Cl.[7] ................................................. H01L 23/02
(52) U.S. Cl. ........................... 257/678; 257/701; 257/723
(58) Field of Search ..................... 257/678, 723, 257/701, 702, 778, 738

(56) References Cited

U.S. PATENT DOCUMENTS

| | | |
|---|---|---|
| Re. 35,119 | 12/1995 | Blonder et al. . |
| 3,373,481 | 3/1968 | Lins et al. . |
| 3,795,037 | 3/1974 | Luttmer . |
| 3,811,186 | 5/1974 | Larnerd et al. . |
| 3,825,353 | 7/1974 | Loro . |
| 3,842,189 | 10/1974 | Southgate . |
| 3,952,404 | 4/1976 | Matunami . |
| 4,067,104 | 1/1978 | Tracy . |
| 4,142,288 | 3/1979 | Flammer et al. . |
| 4,326,663 | 4/1982 | Oettel . |
| 4,447,857 | 5/1984 | Marks et al. . |
| 4,520,562 | 6/1985 | Sade et al. . |
| 4,629,957 | 12/1986 | Walteis et al. . |

(List continued on next page.)

FOREIGN PATENT DOCUMENTS

| | | |
|---|---|---|
| 0072673A2 | 2/1983 | (EP) . |
| 0 352 020 A3 | 1/1990 | (EP) . |
| 0 433 997 A2 | 6/1991 | (EP) . |
| 2151529A | 12/1984 | (GB) . |
| 2142568A | 1/1985 | (GB) . |
| 6191939 | 5/1986 | (JP) . |
| 1-155633 | 6/1989 | (JP) . |
| 3-108734 | 5/1991 | (JP) . |
| WO 94/03036 | 2/1994 | (WO) . |
| WO 96/02068 | 1/1996 | (WO) . |

OTHER PUBLICATIONS

Research Disclosure No. 322 (Feb. 1991) "Method of Testing Chips and Joining Chips to Substrates," XP 000169195.
"Method of Testing Chips and Joining Chips to Substrates", Research Disclosure, Feb. 1991, No. 322, Kenneth Mason Publication Ltd., England.
IBM Technical Disclosure Bulletin, vol. 36, No. 07, Jul. 1993.

Primary Examiner—Roy Potter
(74) Attorney, Agent, or Firm—Lerner, David, Littenberg, Krumholz & Mentlik, LLP

(57) ABSTRACT

A packaged semiconductor chip including the chip, and a package element such as a heat sink is made by connecting flexible leads between contacts on the chip and terminals on a dielectric element such as a sheet or plate and moving the sheet or plate away from the chip, and injecting a liquid material to form a compliant layer filling the space between the package element and the dielectric element, and surrounding the leads. The dielectric element and package element extend outwardly beyond the edges of the chip, and physically protect the chip. The assembly may be handled and mounted by conventional surface mounting techniques. The assembly may include additional circuit elements such as capacitors used in conjunction with the chip.

15 Claims, 6 Drawing Sheets

U.S. PATENT DOCUMENTS

| | | |
|---|---|---|
| 4,661,192 | 4/1987 | McShaen . |
| 4,667,219 | 5/1987 | Lee et al. . |
| 4,721,995 | 1/1988 | Tanizawa . |
| 4,751,199 | 6/1988 | Phy . |
| 4,785,137 | 11/1988 | Samuels . |
| 4,793,814 | 12/1988 | Zifcak et al. . |
| 4,812,191 | 3/1989 | Ho et al. . |
| 4,893,172 | 1/1990 | Matsummoto et al. . |
| 4,926,241 | 5/1990 | Carey . |
| 4,937,653 | 6/1990 | Blonder et al. . |
| 4,949,158 | 8/1990 | Ueda . |
| 4,954,878 | 9/1990 | Fox et al. . |
| 4,955,523 | 9/1990 | Calomagno et al. . |
| 5,047,830 | 9/1991 | Grabbe . |
| 5,049,085 | 9/1991 | Reylek et al. . |
| 5,055,907 | 10/1991 | Jacobs . |
| 5,057,460 | 10/1991 | Rose . |
| 5,067,007 | 11/1991 | Kanji et al. . |
| 5,086,337 | 2/1992 | Noro et al. . |
| 5,131,852 | 7/1992 | Grabbe et al. . |
| 5,138,433 * | 8/1992 | Hiruta ................................. 257/723 |
| 5,148,265 * | 9/1992 | Khandros et al. ..................... 357/80 |
| 5,148,266 | 9/1992 | Khandros et al. . |
| 5,152,695 | 10/1992 | Grabbe et al. . |
| 5,166,099 | 11/1992 | Ueda et al. . |
| 5,173,055 | 12/1992 | Grabbe . |
| 5,192,716 | 3/1993 | Jacobs . |
| 5,197,892 | 3/1993 | Yoshizawa et al. . |
| 5,210,939 | 5/1993 | Mallik et al. . |
| 5,230,931 | 7/1993 | Yamazaki et al. . |
| 5,254,811 | 10/1993 | Ludden et al. . |
| 5,286,680 | 2/1994 | Cain . |
| 5,346,861 | 9/1994 | Khandros et al. . |
| 5,455,390 | 10/1995 | DiStefano et al. . |
| 5,518,964 | 5/1996 | DiStefano et al. . |
| 5,528,083 | 6/1996 | Malladi et al. . |
| 5,663,106 | 9/1997 | Karavakis et al. ..................... 29/841 |
| 5,776,796 | 7/1998 | DiStefano et al. ................... 438/106 |
| 5,841,193 * | 11/1998 | Eichelberger ...................... 257/723 |
| 5,929,517 | 7/1999 | DiStefano et al. ................... 257/707 |

* cited by examiner

FAN-OUT SEMICONDUCTOR CHIP ASSEMBLY

CROSS REFERENCE TO RELATED APPLICATIONS

This is a division, of application Ser. No. 08/653,016, filed on May 24, 1996 U.S. Pat. No. 5,688,716 which in turn is a continuation-in-part of application Ser. No. 08/440,665, filed May 15, 1995 U.S. Pat. No. 5,801,441 which in turn is a divisional of application Ser. No. 08/271,768, filed Jul. 7, 1994, now U.S. Pat. No. 5,518,964.

FIELD OF THE INVENTION

The present invention relates to semiconductor chip assemblies and to methods and components useful in making such assemblies.

BACKGROUND OF THE INVENTION

Complex microelectronic devices such as modern semiconductor chips require numerous connections to other electronic components. For example, a complex microprocessor chip may require many hundreds of connections to external devices.

Semiconductor chips commonly have been connected to electrical traces on mounting substrates by one of three methods: wire bonding, tape automated bonding, and flip-chip bonding. In wire bonding, the semiconductor chip is positioned on a substrate with a bottom or back surface of the chip abutting the substrate and with the contact-bearing front or top surface of the chip facing upwardly, away from the substrate. Individual gold or aluminum wires are connected between the contacts on the semiconductor chip and current conducting pads on the substrate. In tape automated bonding a flexible dielectric tape with a prefabricated array of leads thereon is positioned over the semiconductor chip and substrate, and the individual leads are bonded to the contacts on the chip and to the current conducting pads on the substrate. In both wire bonding and conventional tape automated bonding, the current conducting pads on the substrate are arranged outside of the area covered by the semiconductor chip, so that the wires or leads fan out from the chip to the surrounding current conducting pads. The area covered by the subassembly as a whole is considerably larger than the area covered by the chip. This makes the entire assembly substantially larger than it otherwise would be. Because the speed with which a microelectronic assembly can operate is inversely related to its size, this presents a serious drawback. Moreover, the wire bonding and tape automated bonding approaches are generally most workable with semiconductor chips having contacts disposed in rows extending along the periphery of the chip. They generally do not lend themselves to use with chips having contacts disposed in a so-called area array, i.e., a grid-like pattern covering all or a substantial portion of the chip front surface.

In the flip-chip mounting technique, the contact bearing surface of the semiconductor chip faces towards the substrate. Each contact on the semiconductor chip is joined by a solder bond to the corresponding current carrying pad on the substrate, as by positioning solder balls on the substrate or contacts of the semiconductor chip, juxtaposing the chip with the substrate in the front-face-down orientation and momentarily melting or reflowing the solder. The flip-chip technique yields a compact assembly, which occupies an area of the substrate no larger than the area of the chip itself. However, flip-chip assemblies suffer from significant problems with thermal stress. The solder bonds between the contacts on the semiconductor chip and the current carrying pads on the substrate are substantially rigid. Changes in the size of the chip and of the substrate due to thermal expansion and contraction in service create substantial stresses in these rigid bonds, which in turn can lead to fatigue failure of the bonds. Moreover, it is difficult to test the semiconductor chip before attaching it to the substrate, and hence difficult to maintain the required outgoing quality level in the finished assembly, particularly where the assembly includes numerous semiconductor chips.

Numerous attempts have been made to solve the foregoing problem. Useful solutions are disclosed in commonly assigned U.S. Pat. Nos. 5,148,265 and 5,148,266. Preferred embodiments of the structures disclosed in these patents incorporate flexible, sheet-like structures referred to as "interposers" or "chip carriers." The preferred chip carriers have a plurality of terminals disposed on a flexible, sheet-like top layer. In use, the interposer is disposed on the front or contact bearing surface of the chip with the terminals facing upwardly, away from the chip. The terminals are then connected to the contacts of the chip. Most preferably, this connection is made by bonding prefabricated leads on the interposer to the contacts on the semiconductor chip, using a tool engaged with the lead. The completed assembly is then connected to a substrate, as by bonding the terminals of the chip carrier to the substrate. Because the leads and the dielectric layer of the chip carrier are flexible, the terminals on the chip carrier can move relative to the contacts on the semiconductor chip without imposing significant stresses on the bonds between the leads and the contacts on the semiconductor chip, or on the bonds between the terminals of the chip carrier and the substrate. Thus, the assembly can compensate for thermal effects. Moreover, the assembly most preferably includes a compliant layer disposed between the terminals on the chip carrier and the face of the semiconductor chip itself as, for example, an elastomeric layer incorporated in the chip carrier and disposed between the dielectric layer of the chip carrier and the semiconductor chip. Such a compliant structure permits displacement of the individual terminals independently towards the chip, and also facilitates movement of the terminals relative to the chip in directions parallel to the chip surface. The compliant structure further enhances the resistance of the assembly to thermal stresses during use, and facilitates engagement between the subassembly and a test fixture during manufacture. Thus, a test fixture incorporating numerous electrical contacts can be engaged with all of the terminals in the subassembly despite minor variations in the height of the terminals. The subassembly can be tested before it is bonded to a substrate so as to provide a tested, known, good part to the substrate assembly operation. This in turn provides very substantial economic and quality advantages.

U.S. Pat. No. 5,455,390 describes a further improvement. Components according to preferred embodiments of the '390 patent use a flexible, dielectric top sheet. A plurality of terminals are mounted on the top sheet. A support layer is disposed underneath the top sheet, the support layer having a bottom surface remote from the top sheet. A plurality of electrically conductive, elongated leads are connected to the terminals on the top sheet and extend generally side by side downwardly from the terminals through the support layer. Each lead has a lower end at the bottom surface of the support layer. The lower ends of the leads have conductive bonding materials as, for example, eutectic bonding metals. The support layer surrounds and supports the leads.

Components of this type can be connected to microelectronic elements such as semiconductor chips or wafers by juxtaposing the bottom surface of the support layer with the contact-bearing surface of the semiconductor chip so as to bring the lower ends of the leads into engagement with the contacts on the chip, and then subjecting the assembly to elevated temperature and pressure conditions. All of the lower ends of the leads bond to the contacts on the semiconductor chip substantially simultaneously. The bonded leads connect the terminals of the top sheet with the contacts on the semiconductor chip. The support layer desirably is either formed from a relatively low-modulus, compliant material, or else is removed and replaced after the lead bonding step with such a compliant material. In the finished assembly, the terminals on the relatively flexible dielectric top sheet desirably are movable with respect to the contacts on the semiconductor chip to permit testing and to compensate for thermal effects. However, the components and methods of the '390 patent provide further advantages, including the ability to make all of the bonds to the chip or other component in a single lamination-like process step.

U.S. Pat. No. 5,518,964, issued on U.S. patent application Ser. No. 08/271,768, the disclosure of which is hereby incorporated by reference herein, discloses still further improvements. Preferred methods according to the '964 Patent include the steps of providing a dielectric connection component or first element having a plurality of terminals, a first surface and a plurality of elongated, flexible leads extending along the first surface, each such lead having a terminal end attached to one of the terminals and a tip end offset from the terminal end in a generally horizontal direction parallel to the first surface. Desirably, the tip ends of all the leads are attached to an associated one of the contacts on a second element, such as a microelectronic device. The preferred methods also include the step of simultaneously forming all of the leads by moving all of the tip ends of the leads relative to the terminal ends thereof and relative to the first element so as to bend the tip ends away from the first element. Desirably the step of moving the tip ends of the respective leads relative to their terminal ends includes the step of moving the second element relative to the first element. The first and second elements desirably move in a vertical direction, away from one another, and may also move in horizontal directions parallel to the surfaces of the elements so as to bend the tip end of each lead horizontally towards its own terminal end and vertically away from the terminal end. The net effect is to deform the leads towards formed positions in which the leads extend generally vertically downwardly, away from the first element. These methods may also include the step of injecting a flowable, desirably compliant dielectric material around the leads after the lead-forming step and then curing the flowable material so as to form a dielectric support layer around the leads.

In particularly preferred methods according to the '964 Patent application, one element is a flexible, dielectric top sheet having terminal structures thereon, and the other element includes one or more semiconductor chips. The resulting assembly thus includes the dielectric top sheet with the terminal structures connected to the associated contacts of the semiconductor chip or chips by the vertically-extending, curved flexible leads, the dielectric top sheet being spaced apart from the semiconductor chip or chips by the dielectric support layer. The terminal structures can be connected to a substrate such as a circuit panel to thereby provide electrical current communication to the contacts on the semiconductor chip or chips. Each terminal structure on the dielectric top sheet is movable with respect to the contacts in the semiconductor chip in horizontal directions parallel to the chip, as well as in vertical directions towards and away from the chip, to take up differences in thermal expansion between the chip and substrate and to facilitate testing and assembly.

The step of attaching the tip ends of the leads to the second element desirably includes the step of bonding the tip ends of the leads to the contacts on the semiconductor chip or chips while the leads are in their initial, undeformed positions. For example, a dielectric sheet having the leads disposed in generally horizontal orientation on its bottom surface may be juxtaposed with a chip or wafer so that the tip ends of the leads are engaged with the contacts of the chip or wafer. Thus, all of the tip ends are bonded simultaneously to the chip contacts. A single simultaneous bonding operation may bond hundreds or thousands of leads. Because the leads are in their initial, undeformed positions when bonded to the contacts, the positions of the lead tips are well controlled at this stage. Preferably, the tip ends of the leads are releasably bonded to the dielectric top sheet. This facilitates registration of the lead tips contacts on the semiconductor chips. As the top sheet is moved upwardly away from the chip or wafer, the tip ends of the leads are released from the top sheet. The '964 Patent also discloses other processes, including processes in which the leads are initially attached to the chip or wafer, and wherein the chip or wafer is engaged with dielectric sheet or other element having contacts thereon and the tip ends of the leads are bonded to the contacts. Although the teachings of the '964 Patent can be applied in manufacture of many different products, one product taught in the '964 Patent is a so-called "chip size package". The finished assembly, with the top sheet, terminals and compliant dielectric support layer, can be mounted within an area of a substrate substantially the same as that required to mount the chip itself.

SUMMARY OF THE INVENTION

One aspect of the present invention provides methods of making semiconductor chip assemblies which incorporate the chips together with auxiliary elements, referred to herein as "package" elements, such as heat sinks or auxiliary electrical devices. Desirably, the assembly is a unitary assembly ready for connection to a larger substrate. Preferred methods according to this aspect of the present invention may include the steps of providing a subassembly including a semiconductor chip with a front surface having contacts thereon and a package element secured in position relative to the chip so that the front surface of the chip faces in a forward or upward direction relative to the package element and so that peripheral portions of the package element project outwardly away from the chip in horizontal directions generally parallel to the front face of the chip. The method further includes the step of providing a dielectric element in the form of a plate or, preferably in the form of a thin, flexible sheet having top and bottom surfaces and terminals on the top surface and positioning the dielectric element to overlie the subassembly with the top surface and terminals facing away from the subassembly, with the central region of the dielectric element being disposed adjacent to the chip and preferably overlying the chip and with a peripheral region of the dielectric element carrying at least some of the terminals overlying a peripheral region of the package element. The method also includes the step of providing first leads electrically connected between the contacts of the chip and the terminals on the dielectric element, the first leads having one end attached to the dielectric element and the other end attached to the chip, and then moving the dielectric element and subassembly relative to one another through a predetermined displacement so that the dielectric element moves with a vertical component of motion away from the subassembly and so that the first leads bent to a vertically extensive orientation in which first lead is flexible, and, curved in vertical directions.

The steps of providing the first leads, connecting them between the chip and the dielectric element may be performed by substantially the same methods as disclosed in the '964 Patent. Thus, the first leads may be carried on the chip or, preferably, on the dielectric element, and each such first lead may have a terminal end permanently bonded to the dielectric element and tip end releasably attached thereto. The tip ends may be bonded to the contacts on the chip by juxtaposing the dielectric element with the chip under heat and pressure, so that all of the tip leads are bonded to the chip contacts simultaneously. Preferably, the tip ends of the leads are releasably bonded to the dielectric element and these releasable bonds are detached during relative movement of the dielectric element and subassembly. The preferred method further includes the step of injecting a curable liquid between the dielectric element and the subassembly and curing the liquid to form a compliant layer supporting the dielectric element above the subassembly. The liquid may be injected under pressure, and the pressure of the liquid may force the dielectric element and subassembly away from one another.

Most preferably, the step of providing the subassembly includes the step of providing at least one peripheral support element disposed alongside of the chip in a peripheral region of the package element, the peripheral support element defining a front face facing codirectionally with the front face of the chip. Most preferably, the front face of the package element is substantially coplanar with the front face of the chip. The dielectric element overlies the front face of the peripheral support element or elements. Where the central region of the dielectric element overlies the front face of the chip, the portions of the compliant layer formed between the front face of the chip and the central region of the sheet will have substantially the same thickness as those portions of the compliant layer disposed between the peripheral regions of the sheet and the peripheral support elements. This assures that those portions of the compliant layer underlying each terminal will have substantially uniform resilient properties, further facilitating testing of the assembly and connection of the assembly to a larger substrate such as a circuit panel or multichip module.

Most preferably, the package element includes a heat sink, such as a metallic plate or vessel, and the heat sink is bonded to a back surface of the chip prior to the step of moving the sheet relative to the subassembly. The package element, and particularly the peripheral support elements included in the package element, desirably include at least one electrical circuit element. Most preferably, the method further includes the step of connecting each such electrical circuit element in circuit with the chip as by connecting the circuit element to some of the first leads. For example, the peripheral support elements may include capacitors, and the capacitors may be connected into the circuit with the power and/or ground connections of the chip. Most desirably, the dielectric element has conductors thereon extending from at least some of the first leads to the peripheral region. The step of connecting the circuit element to the first leads may include the step of providing second leads disposed between the peripheral region of the dielectric element and the circuit elements and connecting the second leads between the circuit elements and at least some of the horizontal conductors before the moving step. Thus, the second leads bend along with the first leads during the moving step.

Most preferably, where the dielectric element is a flexible sheet, the method further includes the step of bringing all of the terminals on the top surface of the sheet to a common plane by engaging the terminals with a fixture and forcing the terminals into substantially coplanar disposition during thereafter injection of the curable liquid, but prior to completion of its cure.

Further aspects of the present invention provide semiconductor chip assemblies. The preferred assemblies according to this aspect of the present invention include a subassembly incorporating a semiconductor chip having a front surface with contacts thereon and a package element attached to the chip, the package element having a central region adjacent to the chip and a peripheral region extending outwardly, away from the chip in horizontal directions generally parallel to the front face of the chip. The assembly further includes a dielectric element such as a flexible dielectric sheet overlying the subassembly. The dielectric element includes a central region overlying the central region of the package element adjacent to the chip, and preferably, overlying the chip as well. The dielectric element also includes a peripheral region overlying the peripheral region of the package element and extending outwardly from the central region of the sheet. The dielectric element has a top surface facing away from the subassembly of the chip and package element and a bottom surface facing toward the subassembly. Electrically conductive terminals are disposed on the top surface of the sheet. Preferably, at least some of the terminals are disposed in the peripheral region of the dielectric element and overlie the peripheral region of the package element. Thus, the terminals "fan out" in horizontal directions away from the chip. The dielectric element preferably is substantially imperforate in the central region of the sheet adjacent to the chip and overlying the chip.

The assembly further includes a compliant layer disposed between the subassembly of the chip and the package element and the dielectric sheet, so that the compliant layer supports the dielectric sheet above the subassembly. The assembly also includes vertically extensive flexible first leads embedded in the compliant layer and extending upwardly from the contacts on the chip to the central region of the dielectric element, the flexible leads being electrically connected between the chip contacts and the terminals on the dielectric element. More preferably, the package element incorporated in the assembly includes a heat sink such as a metallic, heat conductive element which also provides some physical protection to the chip as well as one or more electrical circuit elements such as capacitors. As discussed above in connection with the method, the electrical circuit elements may be connected in circuit with the chip through horizontal conductors on the dielectric element and, preferably, through second leads extending between the circuit elements and the dielectric element.

Preferred assemblies according to this aspect of the present invention provide a unitary package including the chip along with auxiliary circuit elements, which can be handled and installed using conventional surface mounting techniques. Because the terminals are "fanned out" and distributed over the peripheral region of the sheet, and preferably, on the central region of the dielectric element as well, the terminals are widely spaced for ease of mounting to the substrate. Although the package as a whole occupies a larger surface area of the substrate than would be occupied by the chip alone, the extra occupied space is not wasted; it is occupied by the auxiliary circuit element which would be required in any event for proper operation of the chip. The entire package can be handled as a unit, thereby simplifying distribution and assembly of the various components to the ultimate substrate. The package also provides good resistance to thermal stress and/or differential expansion and contraction of the substrate and the chip. Furthermore, the most preferred assemblies can be readily tested and can be mounted to a substrate even where the substrate has a coefficient of thermal expansion widely different from that of the chip and/or where the substrate is warped.

These and other objects, features and advantages of the present invention would be more readily apparent from the detailed description set forth below, taken in conjunction with the accompanying drawings

DETAILED DESCRIPTION OF THE PREFERRED EMBODIMENTS

Figure 1:
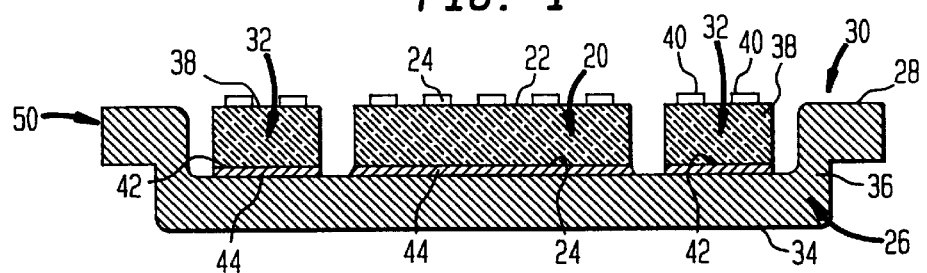
FIG. 1 is a diagrammatic sectional view of a subassembly used in a process according to one embodiment of the invention.
Figure 2:
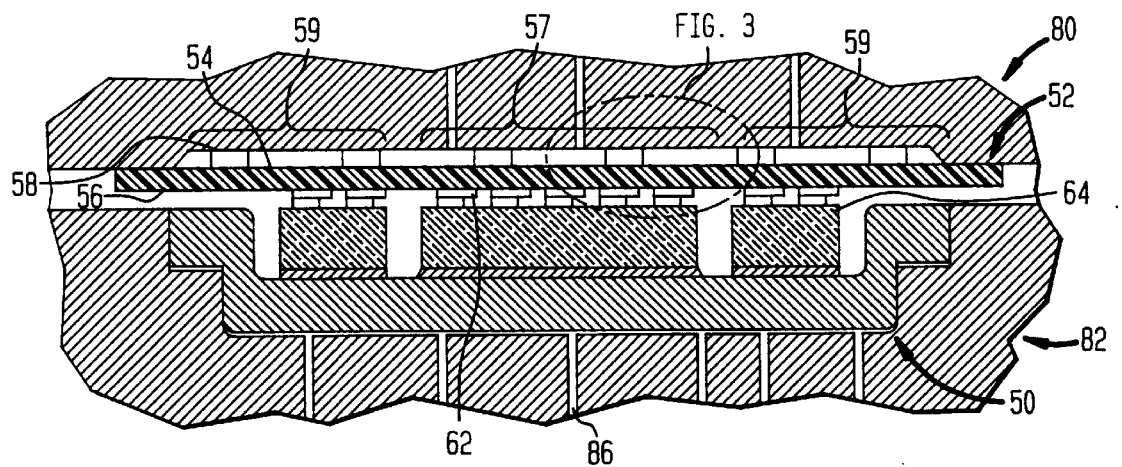
FIG. 2 is a further diagrammatic sectional view depicting the subassembly of FIG. 1 in conjunction with other components during a later stage of the process.
Figure 7:
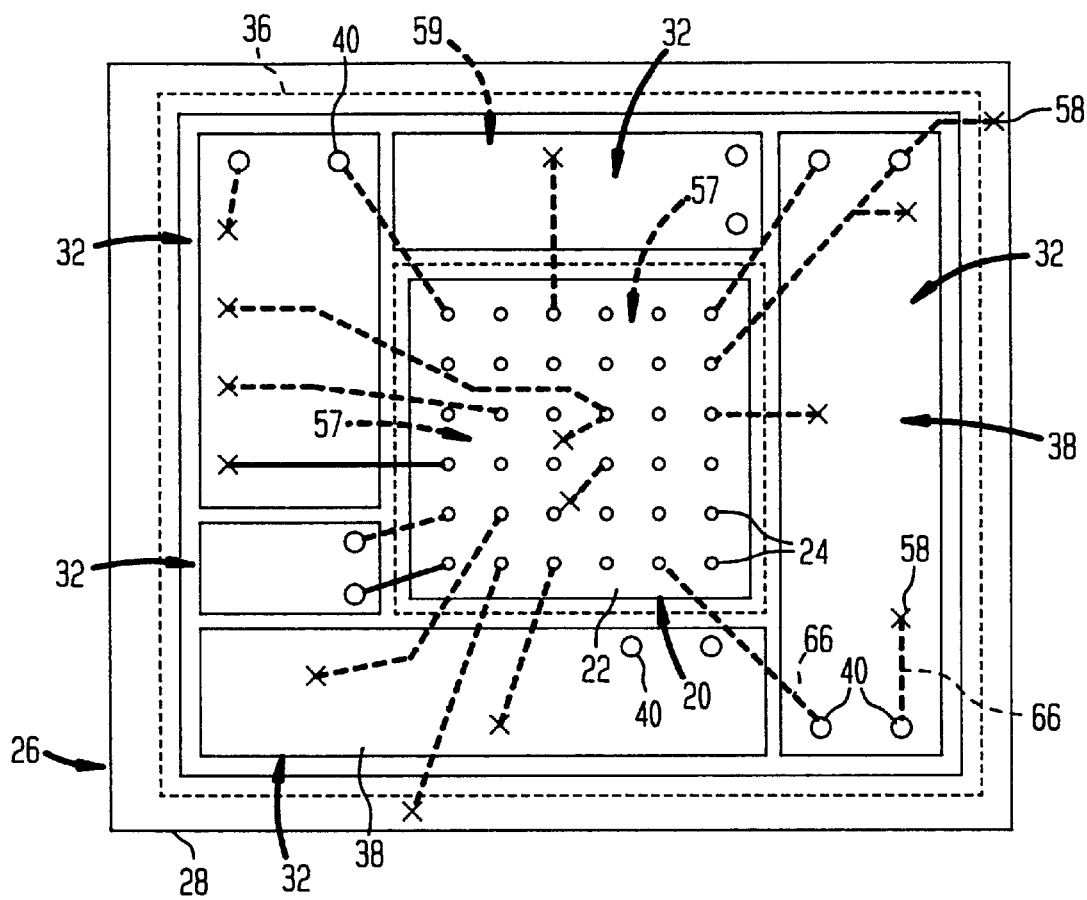
FIG. 7 is a diagrammatic plan view of components illustrated in FIGS. 1–6, with portions removed for clarity of illustration.

A process in accordance with one embodiment of the present invention utilizes a semiconductor chip 20 having a front surface 22 with contacts 24 thereon and having an oppositely facing rear surface 24. The particular chip 20 illustrated in FIG. 1 has the contacts 24 disposed in an "area array", i.e., an array covering substantially the entire front surface of the chip, with the contacts being uniformly spaced within the array. However, other types of chips may be used as, for example, chips having contacts disposed in rows adjacent the peripheral edges of the chip. Chip 20 is assembled with a composite package element 30 including a heat sink 26 and capacitors 32. Heat sink 26 is in the form of an open shell having a base wall 34, an edge wall 36 projecting from the base wall around the periphery thereof and a flange at the extremity of the base wall defining a generally planar flange surface 28 remote from the base wall. The auxiliary circuit elements or capacitors 32 are formed as generally rectilinear blocks each having a front surface 38 with terminals 40 thereon and a rear surface 42 facing oppositely from the front surface. As best seen in FIGS. 1, 2, and 7 circuit elements or capacitors 32 are disposed in a ring-like array adjacent the flange 28 and peripheral wall 36 of the heat sink. The front surfaces 38 of the capacitors or auxiliary circuit elements 32 are substantially coplanar with another and substantially with the flange surface 28 of the heat sink. The rear surfaces 42 of the circuits element 38 are bonded to the base wall 34 of the heat sink by a thermally conductive adhesive layer 44. Adhesive layer 44 may include any of the well-known thermally conductive adhesive compositions, such as an epoxy loaded with metallic particles.

Semiconductor chip 20 is disposed in the center of the ringlike array of circuit elements. The rear face 24 of the chip is bonded to the base wall 34 of the heat sink by a further layer of thermally conductive epoxy 44. The thickness or front to rear face dimension of chip 20 is the same as the corresponding dimensions of the auxiliary circuit elements or capacitor 38. The front face 22 of chip 20 is substantially coplanar with the front faces 38 of the auxiliary circuit elements or capacitor 32 and with the flange 28 of the heat sink. As used in this disclosure, the term "substantially coplanar" means that the surfaces are coplanar with one another to within about 125 microns or less. Although gaps are shown between adjacent edges of the chip and auxiliary circuit elements 32, and between the various auxiliary circuit elements, it should be appreciated that the size of these gaps is exaggerated in the drawings for clarity of illustration. Preferably, the various components are separated from one another by horizontal distances of no more than about 0.5 mm. The auxiliary circuit elements and the chip are positioned precisely on the heat sink relative to one another, so that the terminals 40 of the auxiliary circuit elements lie in predetermined spatial relationship to the terminals 24 of the chip. As discussed below, the contacts 40 of the auxiliary circuit elements 32 are connected to leads in a common process with the contacts 24 of the chip, and the predetermined spatial relationship should be maintained to facilitate simultaneous connection of all of these contacts. The degree of accuracy with which the auxiliary circuit elements must be positioned relative to the chip is inversely related to the size of the contacts on the auxiliary circuit elements. Typically, the auxiliary circuit elements require fewer contacts than the chip itself and possess substantial front-surface area over which the contacts can be distributed. Thus, the contacts 40 on the auxiliary circuit elements may be substantially larger than the contacts 24 on the chip.

Figure 3:
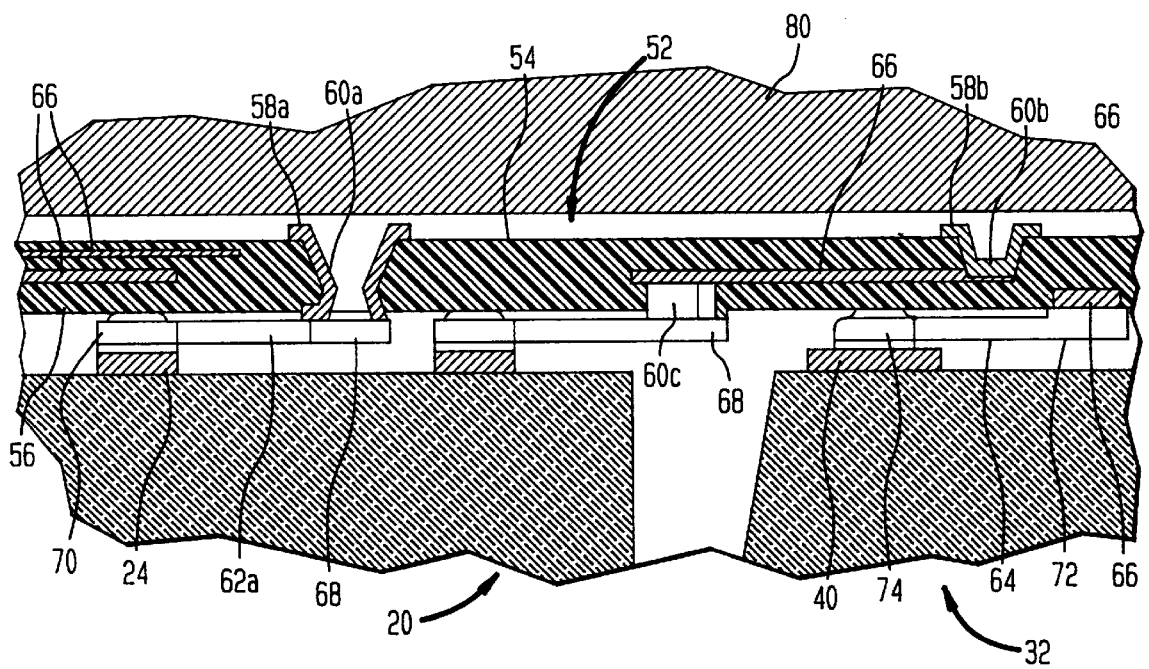
FIG. 3 is a diagrammatic sectional view on an enlarged scale depicting a portion of the elements shown in FIG. 2.

In the next stage of the process, the subassembly 50, shown in FIG. 2, including the auxiliary circuit elements, heat sink and chip is juxtaposed with a flexible, sheetlike dielectric element 52. The dielectric element 52 includes a dielectric body incorporating one or more layers of a flexible, but substantially inextensable dielectric material. These flexible layers may include thin sheets of polyimide, typically having an aggregate thickness of about 25 microns (0.001 inch). Dielectric sheet 52 has a top surface 54 and a bottom surface 56. The sheet has a central region 57 overlying the chip, and a peripheral region 59 surrounding the central region. Electrically conductive metallic terminals 58 are distributed substantially uniformly over the entire area of the top surface, including the central region and the peripheral region. As best seen in FIG. 3, the terminals 58 are formed as the upper extremities of metal-lined vias extending vertically within the dielectric element 52. The dielectric element further has first leads 60 extending along the bottom surface 56 in central region 57, and second leads 64 extending along the bottom surface 56 in a peripheral region 59. The dielectric sheet also has conductors 66 extending horizontally along the sheet. The conductors may extend on the top surface 54, on the bottom surface 56, or between the surfaces.

Each first lead 62 has a terminal end 68 (FIG. 3) permanently attached to the bottom of sheet 52 and a tip end 70 remote from such terminal end releasably attached to the bottom surface of the sheet. The permanent attachment may be constituted by a metallurgical bond between the terminal ends 68 and the vias 60 extending through the sheet or into the sheet from the bottom surface 56. The structure of these leads may be the same as described in the aforementioned '964 Patent. Merely by way of example, leads 62 may have curved sections extending between the tip ends and the terminal ends. The second leads 64, in peripheral region 59, have a generally similar configuration. Thus, each such second lead has a terminal end 72 permanently attached to the sheet and a tip end 74 releasably attached to the sheet bottom surface 56. Each of the tip ends 70 and 74 may have bonding material thereon. The bonding materials may be eutectic bonding alloys or other materials which can be captivated upon exposure to elevated temperature and which form a solid bond with the leads and contacts. For example, where the lead tip ends and the chip contacts include gold, the bonding material may include tin silicon or alloys thereof with gold. Many other bonding materials are described in the '964 Patent, and can be used in the present invention.

The terminals 58, first leads 62, and second leads 64 are electrically interconnected with one another. Some or all of the first leads 62 are electrically connected to terminals 58 by vias 60 and by conductors 66 on the sheet. Some of the terminals, such as terminal 58a disposed in the central region of the sheet may be directly connected to the terminal ends of first leads, such as lead 62a, whereas other terminals 58b disposed in the peripheral region of the sheet are connected to the terminal ends of the associated leads by conductors 66 and one or more of the vias 60. The terminal ends 72 of the second leads may be connected to certain conductors 66. Some of the conductors thus interconnect the terminal end of a first lead 62 with the terminal end of a second lead 64. Others of the terminal ends of the second leads 64 can be connected to other terminals 58.

As best seen in FIGS. 2 and 3, sheet 58 is juxtaposed with subassembly 50 by holding the sheet on an upper tool or platen 80, holding the subassembly 50 in a lower tool or platen 82 and aligning the two tools so that the tip ends 70 of first leads 62 are aligned with the contacts 24 of the chip and so that the tip ends 74 of the second leads 64 are aligned with the contacts 40 of the auxiliary circuit elements or capacitors 32. The sheet and subassembly may be held in a position on the tools during this process by any convenient mechanical method as, for example, by vacuum ports 86 in the tools, or by temporarily bonding the sheet and/or the heat sink to their respective tools. Preferably, the upper tool 80 is transparent, or includes a transparent window, so that the dielectric sheet can be aligned with the chip under manual, visual control or by automated vision systems. The techniques used for aligning the sheet with the subassembly may be similar to those used for aligning elements as described in the '964 Patent. Provided that the relative positions of the auxiliary circuit elements or capacitors 32 and chip 20 are controlled as discussed above during formation of the subassembly, the tip ends or the leads can be aligned with the associated contacts on the chip and auxiliary circuit elements simultaneously. Where the contacts 40 on the auxiliary circuit elements are larger than the contacts 24 on the chip, the alignment can be controlled so as to precisely match the positions of the first lead tip ends 70 with the chip contacts 24. Even if the auxiliary circuit elements are slightly out of nominal position relative to the chip, the tip ends 74 of the second leads 64 will still be aligned with the relatively large contacts on these elements.

Tools 80 and 82 are forced together so as to force all of the tip ends of the leads into engagement with the associated contacts, and heat is applied so as to activate the bonding material on the tip ends of the leads, thereby fusing the tip ends of the lead to the contacts 24 and 40 on the chip and on the auxiliary circuit element. The space between the subassembly and sheet is substantially evacuated. Tools 80 and 82 may be provided with suitable seals around their peripheries (not shown) and suitable ports for connecting the space between the sheet and subassembly to a vacuum source to accomplish such evacuation. In the next stage of the process (FIGS. 4 and 5), sheet 52 and subassembly 50 are moved vertically away from one another by moving tool 80 vertically away from tool 82. During this stage of the process, the subassembly and sheet are held in engagement with tools 80 and 82, as by vacuum applied through ports 86 or by other suitable means. During the moving step, a curable liquid 90 adapted to form a compliant material upon curing such as a liquid precursor adapted to form a silicone gel upon curing is injected under pressure into the space between the sheet and the subassembly. The pressure of liquid 90 also tends to force sheet 52 upwardly against tool 80 and thereby tends to force the terminals 58 into engagement with the planar surface 81 of the tool. Stated another way, the contacts 58 are forcibly moved into coplanar alignment with one another by the fluid pressure.

Figure 4:
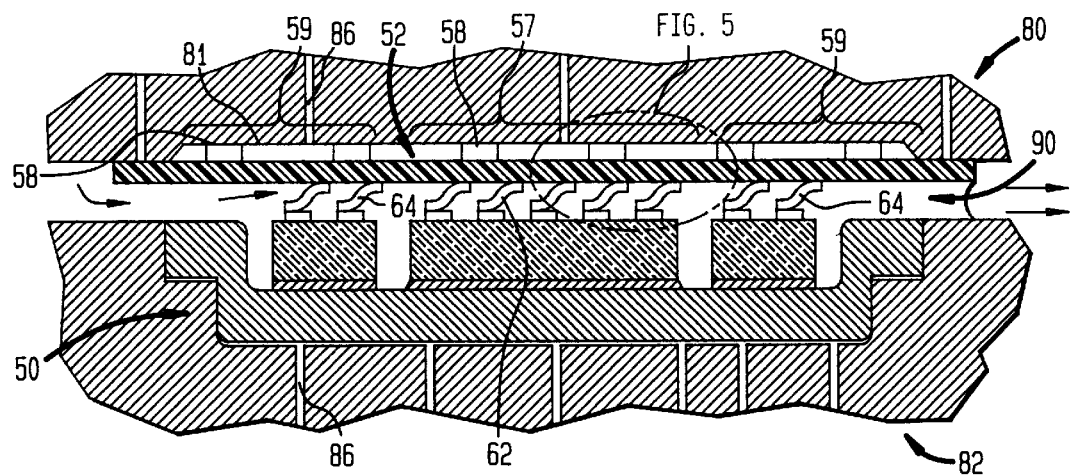
FIG. 4 is a view similar to FIG. 2, but depicting the elements at a later stage during the process.
Figure 5:
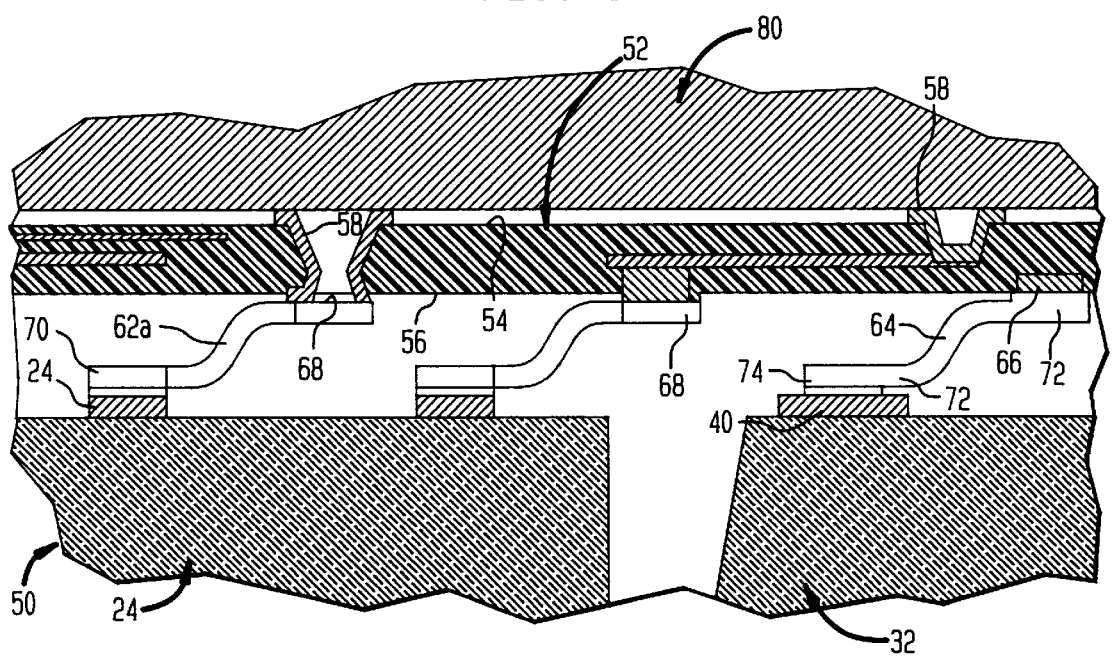
FIG. 5 is a diagrammatic view on an enlarged scale similar to FIG. 3, but depicting the components at the stage of the process illustrated in FIG. 4.

As the sheet moves upwardly, away from the subassembly 50, the tip ends 70 and 74 of the leads remain in place on the chip contacts 24 and circuit element contacts 40, so that the tip ends become detached from the bottom surface 56 of sheet 52. The terminal ends 68 and 72 of the leads remain attached to the bottom surface of the sheet. Thus, all of the first leads 62 and all of the second leads 64 are bent upwardly, into vertically extensive, generally S-shaped curved configurations as shown in FIGS. 4 and 5. As used in this disclosure, the term "vertically extensive" means that the leads have substantial extent in the vertical direction, transverse to the front surface 22 of the chip and also transverse to the planar front surfaces 38 and 28 of the package element. Even after the moving step, however, the leads continue to have substantial horizontal extent as well. In the bent configuration, all of the leads have substantial flexibility in all directions. That is, the terminal end of each lead is free to move in horizontal and vertical directions relative to the tip end of the lead.

Figure 6:
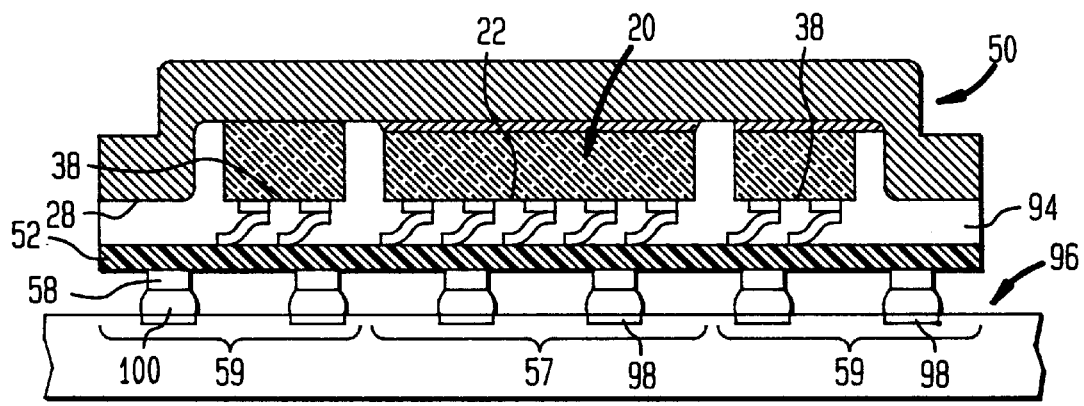
FIG. 6 is a diagrammatic sectional view depicting the subassembly produced in the method of FIGS. 1–5.

The injected liquid 90 forms a compliant layer 94 (of FIG. 6) between assembly 50 and dielectric sheet 52. The thickness of the compliant layer is greatly exaggerated in the drawings for clarity of illustration. In practice, the thickness of the compliant layer is between about 0.05 and about 2.0 mm, and more preferably between about 0.75 and about 0.5 mm. Because surfaces 38 and 28 of the auxiliary circuit elements and the heat sink are substantially coplanar with the front surface 22 of chip 20, those portions of the compliant layer disposed between the peripheral region 59 of the sheet and the auxiliary circuit element or flange, has substantially the same thickness as those portions disposed between the central region 57 of the sheet and the chip. Thus, the dielectric layer supports all of terminals 58 above the subassembly 50 with substantially the same resilient properties and spring constant. The dielectric layer 94 decouples sheet 52 from assembly 50 and hence allows movement of the sheet and terminals in all directions relative to the subassembly.

After curing, the edges of sheet 52 and any excess compliant material can be trimmed away from the assembly. The resulting assembly can be tested by engaging all of the terminals 50 with terminals on a test fixture (not shown). The compliant layer facilitates such engagement. The assembly can be assembled to a substrate 96 (FIG. 6) such as a circuit panel having contact pads 98 thereon as by interposing solder masses 100 between terminals 58 and the contact pads and sattering the assembly in place. This operation may be performed using standard surface mount soldering techniques.

As schematically depicted in FIG. 7, some of the terminals 58 (schematically denoted by the symbol "x") are interconnected by the conductors 66 with the terminals 40 of auxiliary circuit elements or capacitors 32, and the terminals 40 of the auxiliary circuit elements are also connected to the contacts 24 of the chip by other conductors 66 on the sheet. Thus, the auxiliary circuit elements are connected in circuit with the chip. As is well-known in the art, such auxiliary circuit elements typically are connected into the circuit at the power and ground connections of a semiconductor chip. Thus, the particular terminals 58, connected to the contact 40 of the auxiliary circuit element are connected to the power and ground connections of substrate 96 and to the power and ground connections of the chip. The other terminals 58 typically are employed for signal connections to the chip.

Numerous variations and combinations of the features described above can be utilized. In one such variation, chip 22 and each of the auxiliary circuit elements 38 can be attached separately to sheet 52. The contacts on the chip 20 are aligned with the tip ends of the first leads 62 and the chip is engaged with the sheet while applying heat and pressure. The contacts of each auxiliary circuit element 32 are aligned with the tip ends of second leads 64 and bonded thereto in a separate operation. A process for engaging plural elements separately with a dielectric sheet is described in detail in copending, commonly assigned U.S. patent application Ser. No. 08/532,528, filed Sep. 25, 1995, the disclosure of which is hereby incorporated by reference herein. After all of the elements have been attached to the sheet and the contacts of the respective elements have been bonded to the tip ends of the respective leads, the back surfaces of the various elements may be bonded to the heat sink 26. Stated another way, the subassembly of the chip with the heat sink and auxiliary circuit elements can be formed in place on the dielectric sheet after the chip and auxiliary circuit elements have been attached to the tip ends of the leads. In a further variant, the auxiliary circuit elements may be omitted and hence the subassembly of the chip and the package element may consist only of the chip and heat sink. In yet another variation, all of the auxiliary circuit elements or capacitors 32 may be formed as a unitary ring-like element. Alternatively or additionally, the package element may include one or more inert blocks or rings having no electrical function, but which serve solely to surround the chip and support the compliant layer and dielectric layer in the finished package. According to yet another variant, the auxiliary electrical circuit elements may include one or more additional chips which are connected in circuit with the principal chip by the conductors on the dielectric element. In this variant, the assembly constitutes a multichip module. In yet another variant, a plurality of assemblies may be formed simultaneously by using a plurality of chips and a plurality of package elements, and a dielectric element large enough to cover all of the chips and package elements. After connecting each chip to the overlying region of the large dielectric element by leads as discussed above, the dielectric element is moved relative to the chips and package elements, and the liquid material is injected to form a large compliant layer. The dielectric element and compliant layer are severed to provide individual modules, each including one chip or a few chips and the associated package element. In a further variant of this approach, the package element may also be a large element, such as a continuous plate. The plate may be cut during the severing step to provide individual package elements, each associated with one module.

Figure 8:
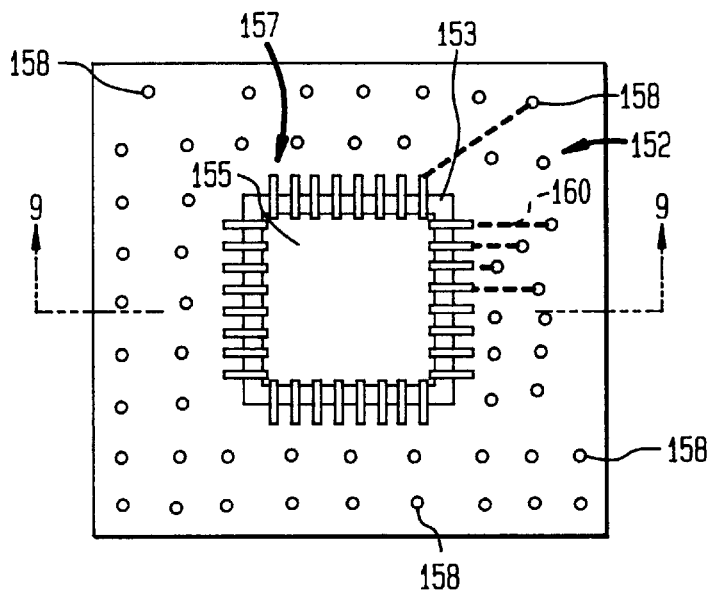
FIG. 8 is a diagrammatic plan view depicting a component used in a further process according to the invention.

In yet another variant, the dielectric sheet 152 (FIG. 8) has elongated apertures merging with one another to form a continuous slot 153 surrounding an island portion 155 within the central region 157 of the sheet, and subdividing portion 155 from the remainder of the sheet. The first leads 162 are disposed in rows extending across slot 153. The leads within each row extend generally parallel to one another. One end of each lead is disposed on island portion 155, whereas the opposite end of each lead 162 is disposed on the main portion of the sheet. Each lead includes a frangible region 163 aligned with or adjacent to slot 153. The lead structures used in this arrangement may be substantially as shown and described in International Patent Publication WO 94/03036, the disclosure of which is hereby incorporated by reference herein. The sheet bears terminals 158 on its top surface, in the peripheral region of the sheet. These terminals are connected by conductors 160 to leads 162. A chip 120 has contacts 124 disposed in rows on the front face of the chip, adjacent to the edges of the chip.

Figure 10:
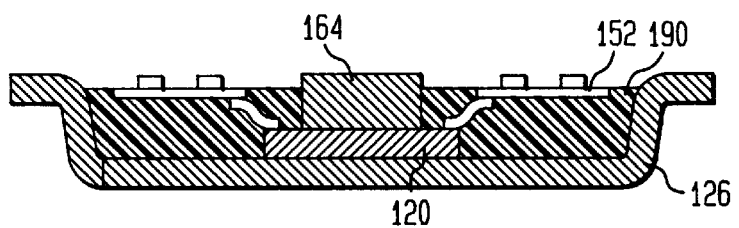
FIG. 10 is a sectional view depicting the completed assembly made by the process according to FIGS. 8–9.

In an assembly process, the chip is aligned with the sheet so that each row of contacts is aligned with a portion of slot 153 and with one row of leads 162. Each lead is bonded to a contact on the chip by engaging the lead with a bonding tool and forcing the lead downwardly, into slot 153, in the manner taught in the '036 publication. The downward movement breaks the frangible section of each lead and detaches the end of the lead from the island region 155 of the sheet. When all of the leads have been connected to the chip in this manner, the island region of the sheet is disconnected from the remainder of the sheet, and can be lifted away from the remainder of the sheet, leaving a hole in the central region of the sheet. A package element such as a heat sink 126 is attached to the back surface of the chip, thus forming a subassembly of the chip and package element. Using procedures similar to those discussed above, the dielectric sheet 152 is then moved upwardly, away from the subassembly, thereby bending leads 162 into a more vertically-extensive orientation shown in FIG. 10. A front-surface heat sink 164 may be positioned on the front surface of the chip, in the hole previously occupied by island region 155. A liquid precursor adapted to form a compliant material is injected between the package element and sheet, thereby forming a compliant layer 190 between the sheet and the package element.

Figure 11:
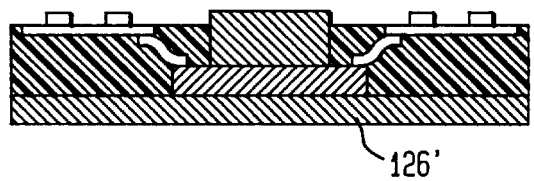
FIG. 11 is a view similar to FIG. 10 but depicting a further embodiment of the invention.

In the embodiment of FIG. 11, the package element or heat sink 126' is a flat plate, without flanges. In other respects, this embodiment is the same as that of FIG. 10.

Figure 9:
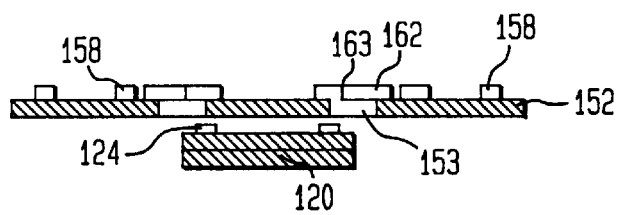
FIG. 9 is a diagrammatic sectional view taken in FIG. 8, but showing the component in conjunction with a semiconductor chip.

Methods and assemblies as discussed above with reference to FIGS. 8–11 may incorporate features as discussed above with reference to FIGS. 1–7. For example, the package element used in the embodiment of FIGS. 8–10 may incorporate auxiliary circuit elements similar to those used in the embodiment of FIGS. 1–7. In this case, the dielectric element may be provided with second leads in the peripheral area for connection to the auxiliary circuit element. Also, in the embodiment of FIGS. 8–10, the island region 155 may be provided with terminals and may remain as part of the finished assembly. Where island region 155 is to remain, the slot 153 need not extend entirely around the island region. Also, apertures having form other than the slot-like aperture 153 may be employed. For example, each lead may extend over a small circular hole, and an array of such holes and leads may be provided in the central region of the dielectric sheet.

Figure 12:
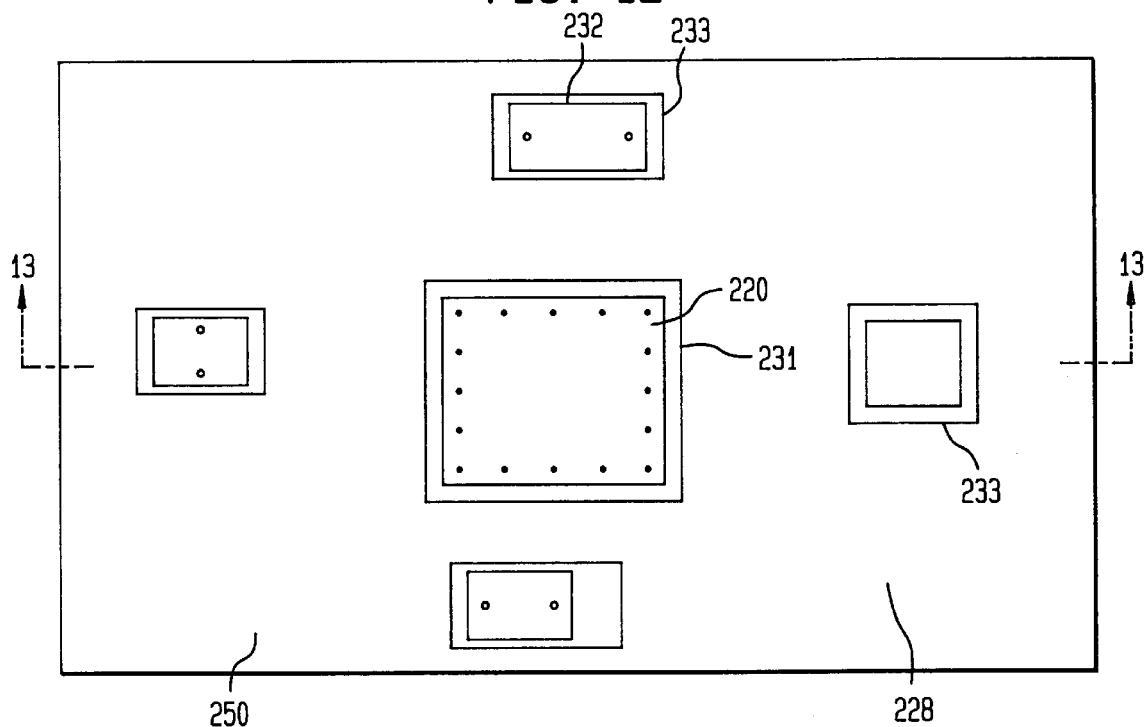
FIG. 12 is a diagrammatic plan view depicting components used in a process according to a further embodiment of the invention.
Figure 13:
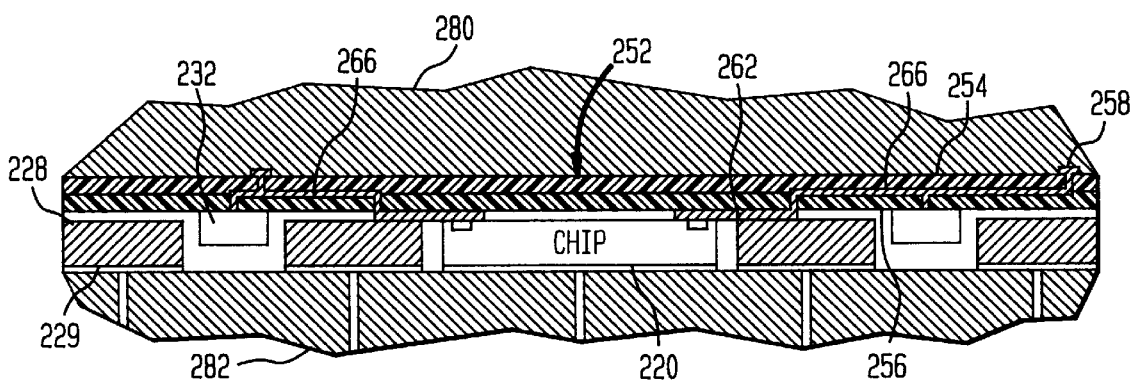
FIG. 13 is a sectional view taken along lines 13—13 in FIG. 12, the components of FIG. 12 in conjunction with further components used in the process.
Figure 14:
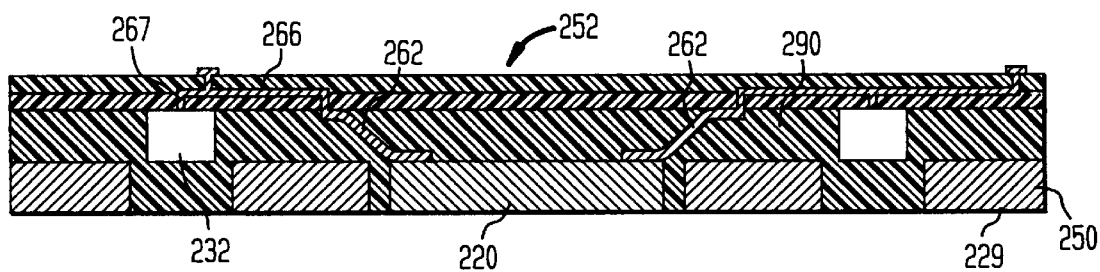
FIG. 14 is a sectional view similar to FIG. 13 but depicting the components during a later stage of the process.

According to a further embodiment of the invention, the package element may include a rigid ring 250 (FIGS. 12–14) having a front face 228 and a rear face 229. The ring has a central opening 231 and several auxiliary openings 233 in the peripheral region of the ring. Electrical circuit elements such as capacitors 232 are disposed in the auxiliary openings, and a chip 220 is disposed in the central opening of the ring. The chip contacts are bonded to the ends of first leads 262 on the bottom surface 256 of a flexible sheetlike dielectric element 252. Here again, the ends of the first leads which are bonded to the chip contacts are releasably attached to the bottom surface of the dielectric element. First leads 262 are connected to terminals 258 on the top surface 254 of the dielectric element by horizontal conductors 266 extending within dielectric element 252. The contacts of circuit elements 232 are connected to some of the horizontal conductors 266, and thus are connected to the chip and terminals, by connecting the contacts to vias 267 extending between the horizontal conductors and the bottom surface of the dielectric element. The contacts on elements 232 are directly bonded to the vias, using a conventional conductive bonding material such as solder, a eutectic bonding alloy or a diffusion bonding alloy. Because vias 267 are fixed to dielectric element 252, the connection between the contacts of the circuit elements and the vias permanently attaches circuit elements 232 to the bottom surface of the dielectric element.

In the assembly process, the rear surface 229 of the ring and the rear surface of chip 220 are held in engagement with a tool 282, as by vacuum applied through ports in the tool, by a temporary adhesive, or by appropriate grips or clamps (not shown). The tool thus holds the chip and ring in fixed position relative to one another. The dielectric element 252 is engaged with another tool 280. A liquid material is injected under pressure between the dielectric element and the subassembly of the chip and ring, and tools 280 and 282 are moved away from one another. In the manner discussed above, the first leads 262 are partially detached from the bottom surface of the dielectric element and are bent so that the bent leads extend vertically as well as horizontally. In this bent condition, leads 262 are flexible. When the dielectric element moves away from the chip and ring, circuit elements 232 move with the dielectric element. The injected liquid material is cured to form a compliant dielectric layer 290. Thus, in the assembly of FIG. 14, the compliant dielectric material extends between the circuit elements 232 and the package element or ring 250. The assembly may be secured to a substrate by bonding terminals 258 to the contact pads of the substrate. Optionally, a protective cover or heat sink may be placed onto the rear surface 229 of the ring, and onto the rear surface of chip 220.

Figure 15:
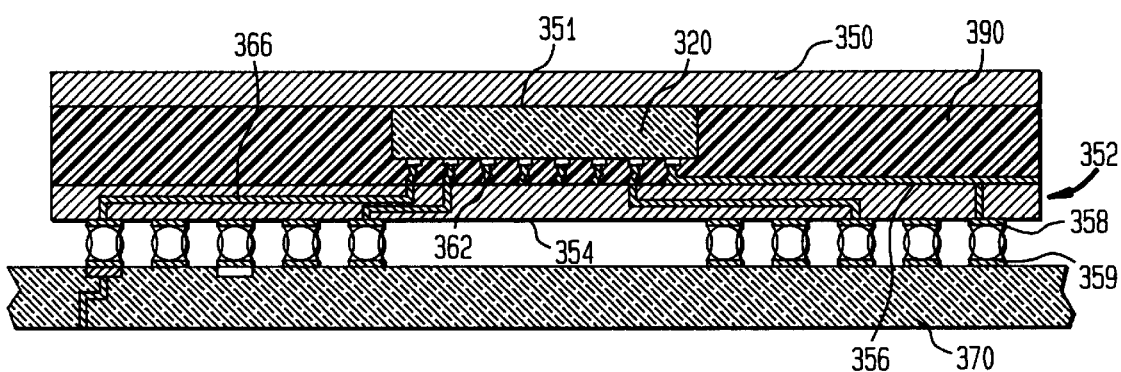
FIG. 15 is a diagrammatic sectional view depicting yet another embodiment of the invention.

In a further embodiment of the invention, the dielectric element 352 (FIG. 15) is a substantially rigid, substantially imperforate dielectric plate formed from a ceramic material. As used in this disclosure with reference to a dielectric element, the term "substantially imperforate" means that at least the central region of the dielectric element overlying the chip 320 is devoid of holes extending between the top surface 354 and the bottom surface 356, or that any holes extending between the top and bottom surfaces are filled by via liners or other conductive elements. Because plate 352 is substantially imperforate, it shields the chip and the associated flexible leads 362 extending between the chip and the dielectric element. As in the embodiments discussed above, the dielectric element has terminals 358 disposed on the top surface 354 (the surface facing away from chip 320). These terminals are arranged in a "fan-out" pattern, so that the terminals are disposed in the peripheral region of the dielectric element, outside of the central region aligned with the chip. The terminals are connected to the chip contacts through flexible leads 362 and horizontal conductors extending within plate 352, on the surfaces of the plate, or both. The package element includes a metallic plate heat spreader 350 secured to the rear surface of the chip by a thermally conductive adhesive 351. Plate 350 extends parallel to plate 352, with the chip disposed therebetween, and with a compliant dielectric layer 390 filling the remaining space between the plates and intimately surrounding flexible leads 362. The plates and the dielectric layer cooperatively protect the chip. The assembly can be handled and mounted readily using conventional surface mounting techniques. Thus, terminals 358 may be provided with bonding materials such as solder balls. As depicted in FIG. 15, the assembly is mounted to a substrate 370, with terminals 358 bonded to contact pads 359 on the substrate by conventional bonds such as solder masses. Substrate 370 desirably has a coefficient of thermal expansion closely matched to the coefficient of thermal expansion of plate 352, so as to minimize differential thermal expansion of these elements. The flexible leads 362 compensate for differential thermal expansion or movement between chip 320 and plate 352.

Assemblies as depicted in FIG. 15 can be fabricated by processes similar to those discussed above, with the rigid plate dielectric element substituted in place of the flexible sheetlike dielectric elements illustrated in FIGS. 1–14. According to other embodiments of the invention, the rigid dielectric element can be formed from materials other than ceramics. For example, fiber-reinforced polymer circuit panels such as glass fiber reinforced epoxy circuit panels may be employed. One suitable type of fiber reinforced panel is commonly referred to as "FR-4".

These and other variations and combinations of the features discussed above can be utilized without departing from the present invention as defined by the claims. Accordingly, the forgoing description of the preferred embodiment should be taken by way of illustration rather than by way of limitation of the invention.

What is claimed is:

1. A semiconductor chip assembly comprising:
   (a) a subassembly including a semiconductor chip having a front surface with contacts thereon and a package element having a central region attached to the chip and a peripheral region extending outwardly away from the chip in horizontal directions generally parallel to the front face of the chip;

(b) a substantially imperforate dielectric clement overlying the subassembly, said dielectric element including a central region overlying the central region of the package element adjacent the chip, and a peripheral region extending outwardly from the central region of said dielectric element and overlying the peripheral region of the package element, said dielectric element having a top surface facing away from the subassembly and a bottom surface facing toward the subassembly and electrically conductive terminals on the top surface, at least some of the terminals being disposed in said peripheral region of said dielectric element;

(c) a compliant layer disposed between the subassembly and dielectric element and supporting the dielectric element above the subassembly; and (d) vertically-extensive flexible first leads embedded in said compliant layer and extending upwardly from the contacts on the chip to the central region of the dielectric element, the flexible leads being electrically connected to the terminals.

2. An assembly as claimed in claim 1 wherein said dielectric element is a flexible dielectric sheet.

3. An assembly as claimed in claim 2 wherein said peripheral portion of said package element defines a substantially planar front surface facing toward the dielectric element, and wherein said compliant layer is of substantially uniform thickness beneath the peripheral region of the dielectric element.

4. An assembly as claimed in claim 3 wherein the central region of the dielectric element overlies the front face of the chip, wherein said front surface of said chip is substantially coplanar with said front surface of the package element, and the compliant layer is of substantially uniform thickness beneath the central and peripheral regions of the dielectric element.

5. An assembly as claimed in claim 4 wherein some of said terminals are disposed in the central region of the dielectric element and overly the chip.

6. An assembly as claimed in claim 4 wherein said first leads extend between the contacts on the chip and the bottom surface of the dielectric element in the central region of the dielectric element.

7. An assembly as claimed in claim 6 wherein the dielectric element has conductive vias extending from said bottom surface toward said top surface and from said top surface towards said bottom surface, said first leads being connected to said terminals by way of said vias.

8. An assembly as claimed in claim 7 wherein said dielectric element has horizontal conductors extending between the central and peripheral regions of the dielectric element, at least some of said terminals being connected to said first conductors by way of said horizontal conductors and said vias.

9. An assembly as claimed in claim 1 wherein said package element includes a metallic heat sink.

10. An assembly as claimed in claim 9 further comprising one or ore electrical circuit elements disposed between said heat sink and the peripheral region of the dielectric element, said one or more electrical circuit elements being connected to said chip.

11. An assembly as claimed in claim 10 wherein said dielectric element has horizontal conductors extending between the central and peripheral regions of the dielectric element, at least some of said terminals being connected to said first leads by way of said horizontal conductors, said circuit elements being connected to said chip by way of said horizontal conductors and said first leads.

12. An assembly as claimed in claim 11 further comprising second flexible leads embedded in said compliant layer and extending from said one or more circuit elements to the peripheral region of the dielectric element and electrically connected to said horizontal leads, said one or more circuit elements being connected to the chip by way of said second leads, horizontal conductors and first leads.

13. An assembly as claimed in claim 1 wherein said dielectric element is substantially rigid.

14. An assembly as claimed in claim 13 wherein said dielectric element includes one or more ceramic materials.

15. An assembly as claimed in claim 13 wherein said dielectric element includes a fiber-reinforced circuit board.

* * * * *

UNITED STATES PATENT AND TRADEMARK OFFICE
CERTIFICATE OF CORRECTION

PATENT NO.      : 6,265,765 B1
DATED           : July 24, 2001
INVENTOR(S)     : Thomas H. DiStefano, John W. Smith, and Anthony B. Faraci It is certified that error appears in the above-identified patent and that said Letters Patent is hereby corrected as shown below:

<u>Column 15,</u>
Line 1, "dielectric clement" should read -- element --.

<u>Column 16,</u>
Line 17, "or ore" should read -- or more --.

Signed and Sealed this

Twelfth Day of March, 2002

Attest:

JAMES E. ROGAN
*Attesting Officer*     *Director of the United States Patent and Trademark Office*